United States Patent
Isozumi et al.

(10) Patent No.: US 6,809,923 B2
(45) Date of Patent: Oct. 26, 2004

(54) POWER SUPPLY UNIT

(75) Inventors: Masashi Isozumi, Okayama (JP); Tsunetoshi Oba, Okayama (JP); Takashi Horie, Okayama (JP); Tadahiko Ogawa, Okayama (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/361,846

(22) Filed: Feb. 11, 2003

(65) Prior Publication Data

US 2003/0174465 A1 Sep. 18, 2003

(30) Foreign Application Priority Data

Feb. 21, 2002 (JP) ........................................ 2002-044631

(51) Int. Cl.[7] .................................................. H05K 5/00
(52) U.S. Cl. ........................ 361/683; 361/679; 174/52.1
(58) Field of Search ................................ 361/679, 683, 361/688, 689, 715, 716, 720, 721, 724, 736; 174/50, 52.1; 370/150

(56) References Cited

U.S. PATENT DOCUMENTS

| | | | |
|---|---|---|---|
| 4,508,402 A | * | 4/1985 | Tomino et al. ............... 439/67 |
| 4,652,769 A | * | 3/1987 | Smith et al. ................... 307/31 |
| 4,958,256 A | * | 9/1990 | Parkhomenko et al. ...... 361/837 |
| 5,424,915 A | * | 6/1995 | Katooka et al. ............. 361/695 |
| 5,943,220 A | * | 8/1999 | Shikata et al. .............. 361/818 |

FOREIGN PATENT DOCUMENTS

JP 11-041951 2/1999

* cited by examiner

Primary Examiner—Dean A. Reichard
Assistant Examiner—Carmelo Oliva
(74) Attorney, Agent, or Firm—Foley & Larnder LLP

(57) ABSTRACT

The power supply unit comprises a power supply circuit accommodating chamber A and an arithmetic circuit accommodating chamber B partitioned from each other by a partition wall, and power supply circuit substrates 7 and 8 and an arithmetic circuit substrate 12 are accommodated in the power supply circuit accommodating chamber A and the arithmetic circuit accommodating chamber B, respectively. A connector of the power supply circuit substrate 8 and a connector of the arithmetic circuit substrate 12 are connected to each other through the partition wall of the power supply circuit accommodating chamber A and the arithmetic circuit accommodating chamber B.

8 Claims, 5 Drawing Sheets

POWER SUPPLY UNIT

BACKGROUND OF THE INVENTION

1. Field of the Invention

The present invention relates to a power supply unit.

2. Description of the Background Art

A large number of parts which generate heat such as a coil, a switch transistor, various diodes and the like are mounted to a power supply unit due to its circuit structure. In a casing, there exists a portion which is heated to a high temperature higher than 100° C. for example.

Therefore, if an arithmetic circuit for calculating an output voltage value or output current value is to be mounted, since using maximum temperatures of a CPU or a digital IC which are constituent parts of the power supply unit are relatively low as low as about 85° C., it is necessary to dispose the arithmetic circuit section sufficiently away from the heat-generating portions included in the power supply unit so that the power supply unit is not adversely affected by heat. For this reason, it is necessary to increase the casing in size, and the entire power supply unit is also adversely increased in size.

SUMMARY OF THE INVENTION

The present invention has been accomplished in view of such circumstances, and it is an object of the invention to provide a power supply unit in which parts having low using maximum temperatures are incorporated without increasing the entire power supply unit in size.

To achieve the above object, the present invention has the following structures.

A power supply unit of the present invention comprises a power supply circuit accommodating chamber and an arithmetic circuit accommodating chamber partitioned from each other by a partition wall, and a power supply circuit substrate and an arithmetic circuit substrate are accommodated in the power supply circuit accommodating chamber and the arithmetic circuit accommodating chamber, respectively.

Here, the accommodating chamber means a chamber capable of accommodating a substrate therein.

According to the present invention, since the partition wall functions as a heat insulation wall, it is possible to dispose and accommodate the arithmetic circuit substrate close to the power supply circuit substrate without receiving influence of heat from the power supply circuit.

In one embodiment of the present invention, at least one of a CPU, an amplifier, a digital IC and an indication LED is contained on the arithmetic circuit substrate.

According to the present invention, if the CPU, the amplifier, the digital IC or the indication LED having relatively low using maximum temperature is contained on the arithmetic circuit substrate, it is possible to incorporate such a part without increasing the power supply unit in size.

In another embodiment of the present invention, the power supply circuit substrate and the arithmetic circuit substrate respectively have connectors, and the connectors are connected to each other through an opening formed in the partition wall.

According to the present invention, it is possible to constitute a power supply unit having a desired additional function, for example, an indicating function or a communication function by connecting an arithmetic circuit of various specifications to one kind of power supply circuit. This is effective for reducing the costs in producing various kinds of power supply units.

In another embodiment of the present invention, the power supply unit further comprises a casing having the power supply circuit accommodating chamber, and an auxiliary case which is opened toward an outer wall of the casing.

According to the present invention, the outer wall of the casing itself functions as the partition wall for partitioning the power supply circuit accommodating chamber and the arithmetic circuit accommodating chamber from each other, the heat insulating structure can easily be formed only of necessary parts, and heat from the power supply circuit can effectively be insulated.

In a preferred embodiment of the present invention, the arithmetic circuit substrate calculates an output voltage value and an output current value of the power supply unit.

According to the present invention, calculated output voltage value or output current value can be indicated using the indicating LED contained on the arithmetic circuit substrate.

DESCRIPTION OF THE PREFERRED EMBODIMENTS

An embodiment of the present invention will be explained below based on the drawings.

Figure 1:
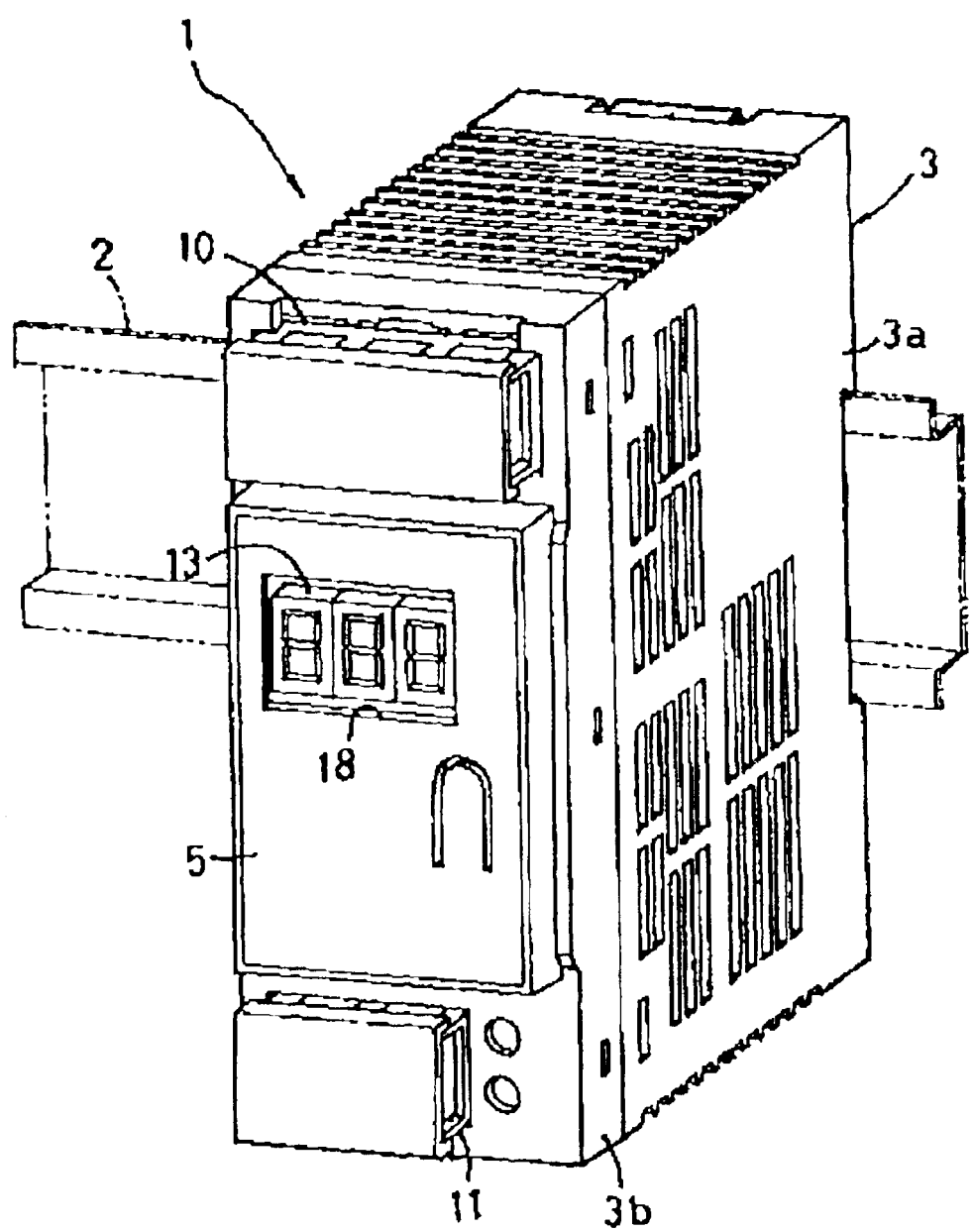
FIG. 1 is a perspective view of an entire power supply unit according to the present invention.
Figure 2:
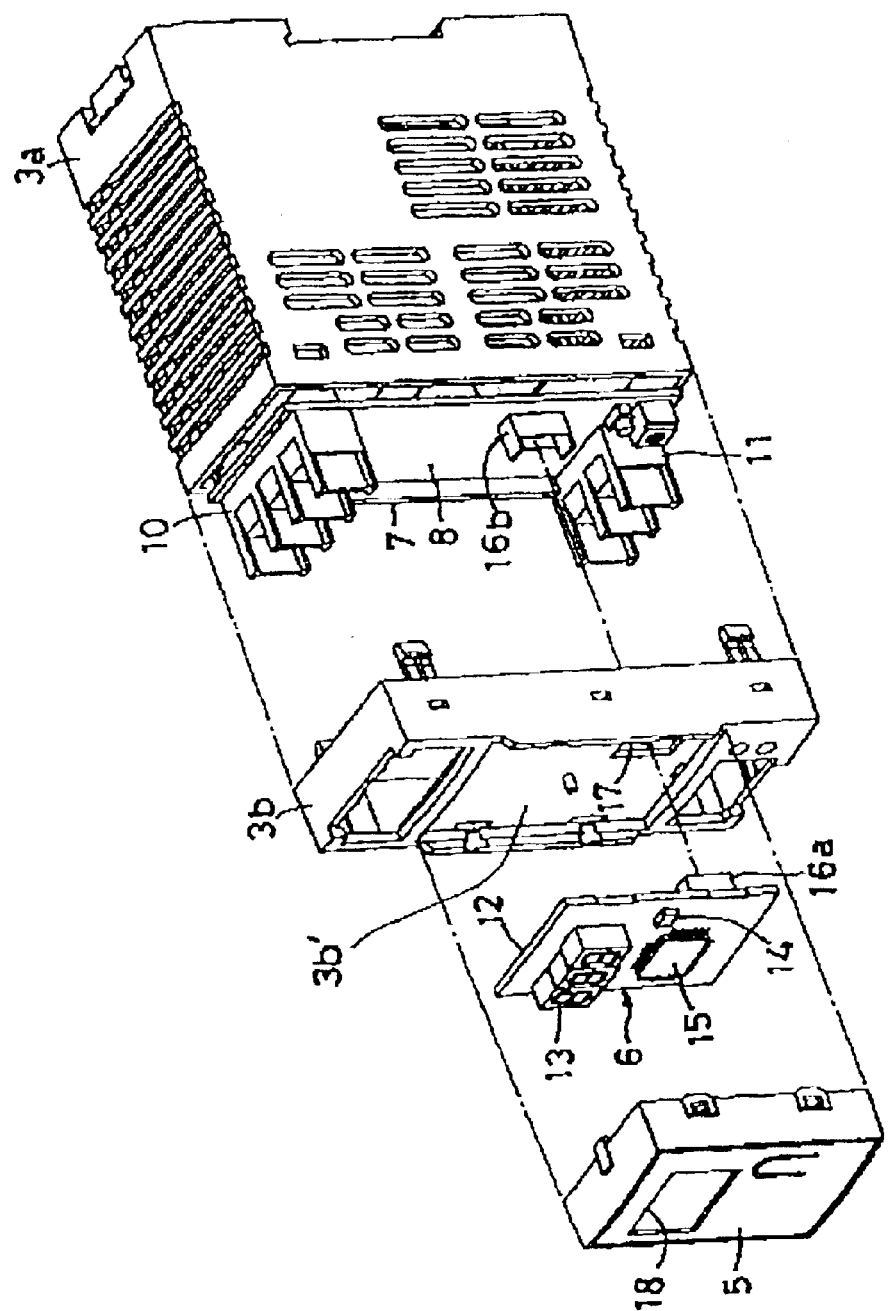
FIG. 2 is an exploded perspective view of the power supply unit shown in FIG. 1.
Figure 3:
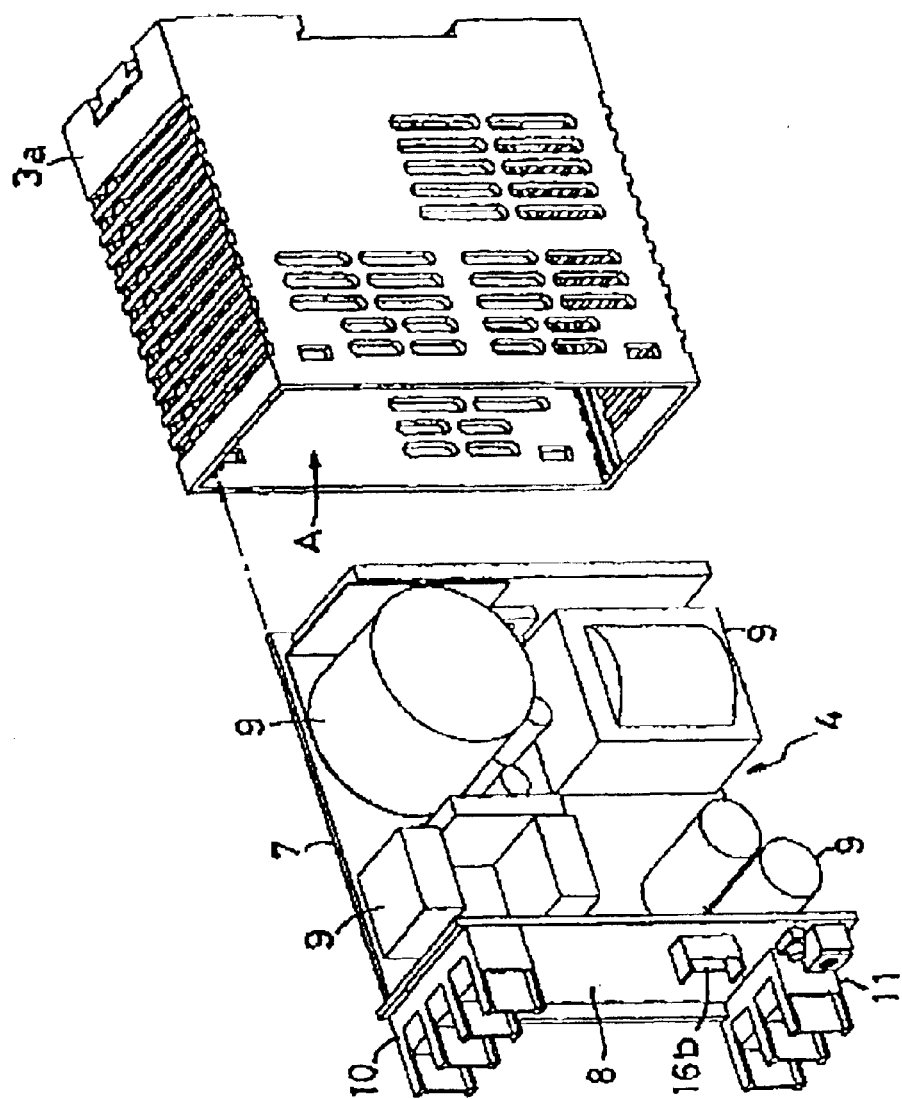
FIG. 3 is an exploded perspective view of the power supply unit shown in FIG. 1.
Figure 4:
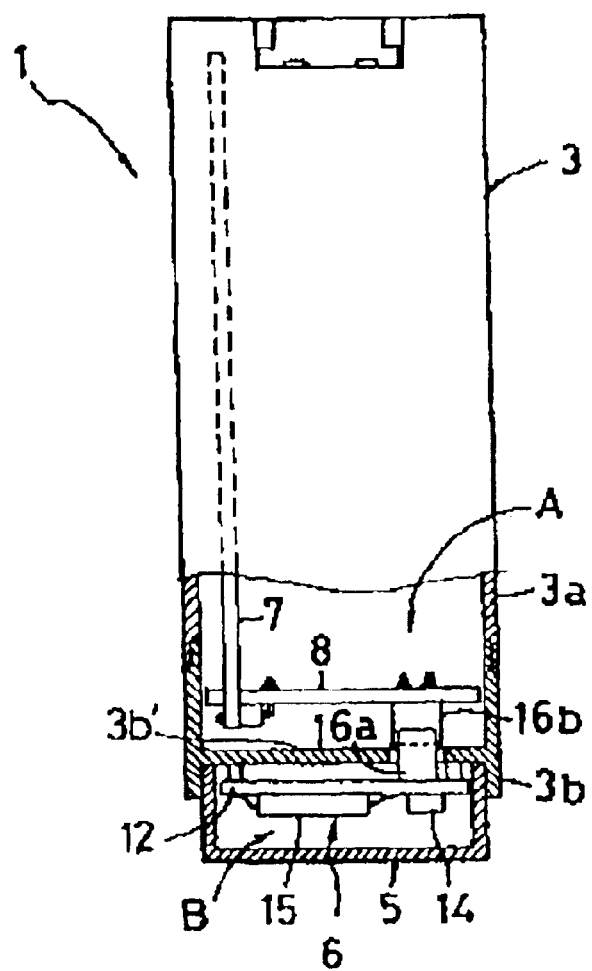
FIG. 4 is a plan view partly in section of the power supply unit.

FIG. 1 is a perspective view of an entire power supply unit 1 according to the present invention. FIGS. 2 and 3 are exploded perspective views thereof. FIG. 4 is a plan view partly in section thereof.

This power supply unit 1 is formed into a box-like unit which is detachably mounted on a front surface a supporting rail 2 such as a DIN rail. The supporting rail 2 is laterally fix to power supply equipment. A casing 3 of the power supply unit 1 includes: a case body 3a which is molded by resin into a box shape and which has an opened depth in a front direction; and a front cover 3b which is engaged and communicated with the front face of the case body 3a and which is made of resin such as polycarbonate. An interior of the casing 3 is constituted as a power supply circuit accommodating chamber A, and a power supply circuit unit 4 is incorporated and supported in the casing 3.

A shallow box-like resin auxiliary case 5 whose rear surface is opened is detachably engaged with and connected to the front surface of the casing 3, i.e., a vertically intermediate portion of a front wall of the front cover 3b. A space is formed as an arithmetic circuit accommodating chamber B between the front cover 3b and the auxiliary case 4, and an arithmetic circuit unit 6 is incorporated and supported in the space.

The power supply circuit unit 4 includes, as a substrate for the power supply circuit, a main substrate 7 facing left and right sides, and a front substrate 8 connected to a front portion of the main substrate 7 such as to face front and rear sides. Various electronic components 9 constituting the power supply circuit is mounted to the main substrate 7. An input terminal blocks 10 and 11 are mounted to the front substrate 8. A terminal screw is not illustrated.

The arithmetic circuit unit 6 includes an arithmetic circuit substrate 12 supported by a front surface of the front cover 3b in parallel. Mounted to the arithmetic circuit substrate 12 are an LED indicator 13 for indicating a voltage set value, an output voltage present value, an output current present value, a peak current value and the like, a mode switch 14 for switching indication modes, a CPU 15 and the like. A connector 16a mounted to a back surface of the arithmetic circuit substrate 12 of the arithmetic circuit unit 6 and a connector 16b mounted to the front substrate 8 of the power supply circuit unit 4 are connected to each other through an opening 17 formed in the front cover 3b so that the power supply circuit unit 4 and the arithmetic circuit unit 6 are electrically connected to each other.

Figure 5:
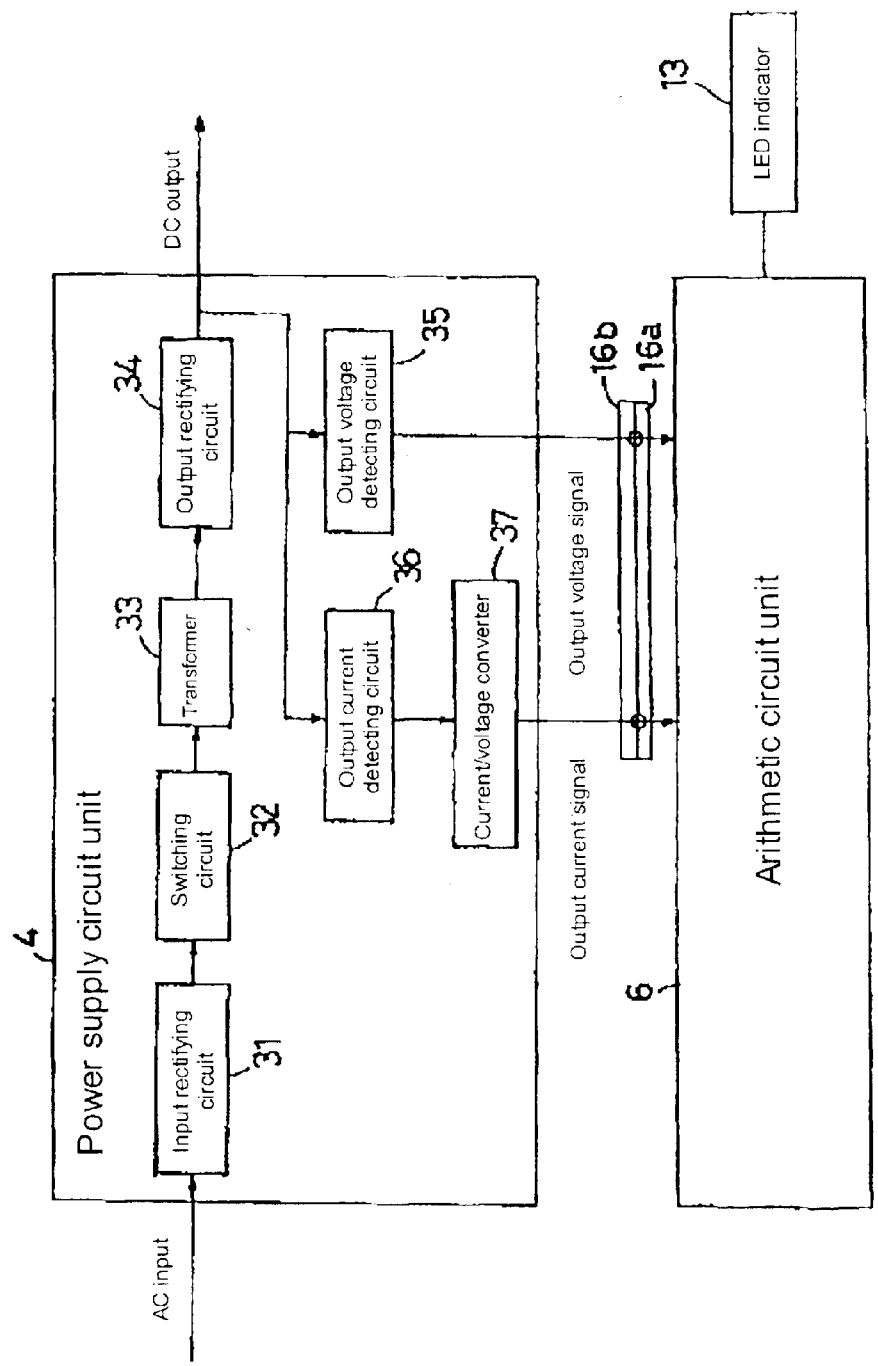
FIG. 5 is a block diagram showing an outline structure of the power supply unit.

FIG. 5 is a block diagram of the power supply unit 1 of this embodiment.

The power supply circuit unit 4 comprises an input rectifying circuit 31 for rectifying and smoothening an AC input, a switching circuit 32 having a switching element such as an FET, a transformer 33 for converting an input into a predetermined output in accordance with on/off operation of the switching element, and an output rectifying circuit 34 for rectifying an output from the transformer 33. This structure is basically the same as that of the conventional technique.

This embodiment includes an output voltage detecting circuit 35, an output current detecting circuit 36 and a current/voltage converter 37 for indicating an output voltage value, an output current value, a peak current value and the like on the LED indicator 13. Outputs of the output voltage detecting circuit 35, the current/voltage converter 37 are sent to the arithmetic circuit unit 6 through the connectors 16a and 16b. The arithmetic circuit unit 6 includes an operational amplifier, an A/D converter (both not shown) and the CPU 15.

According to this embodiment, as shown in FIGS. 2 and 4, a central portion 3b' of the front cover 3b which is a front wall of the casing 3 functions as a heat-insulating partition wall for insulating the power supply circuit accommodating chamber A and the arithmetic circuit accommodating chamber B, and heat from the power supply circuit unit 4 is effectively insulated. With this, it is possible to dispose the arithmetic circuit substrate 12 close to the power supply circuit substrates 7 and 8, and the entire unit can be reduced in size.

The front substrate 8 is formed with a circuit pattern having a relatively thickness, for example, a wide area (not shown). Noise emission from a switching element and the like in the power supply circuit unit 4 is absorbed and shield by the circuit pattern so that the noise is prevented from being transmitted to the arithmetic circuit unit 6.

With this structure, although the power supply circuit unit 4 and the arithmetic circuit unit 6 are close to each other, the arithmetic circuit unit 6 can appropriately be operated without being adversely affected by the noise emission.

As another embodiment of the present invention, a metal film may be formed or metal may be evaporated on a surface of the front cover 3b on the side of the power supply circuit unit 4 to shield the noise emission.

The present invention can also be carried out in the following manners:

(1) The embodiment in which the power supply circuit accommodating chamber A and the arithmetic circuit accommodating chamber B are insulated from each other is not limited to the above structure. For example, a space which is opened inward (rearward) is formed in the front cover 3b in the casing 3, and the opening can be closed by a separately formed resin cover to form the arithmetic circuit accommodating chamber.

(2) When the arithmetic circuit unit 6 does not have the LED indicator 13, an auxiliary case 5 having no indication opening may be mounted instead of the auxiliary case 5 having the indication opening. It is possible to arbitrary use an auxiliary case 5 having specifications corresponding to function for the arithmetic circuit unit.

As explained above, according to the present invention, the power supply circuit accommodating chamber and the arithmetic circuit accommodating chamber are partitioned by the partition wall. Therefore, it is unnecessary to largely separate the arithmetic circuit substrate and the power supply circuit substrate from each other for heat insulation, it is possible to disposed the arithmetic circuit substrate close to the power supply circuit substrate without being adversely effected by heat from the power supply circuit unit, and the arithmetic circuit unit can be incorporated while reducing the entire unit in size.

What is claimed is:

1. A power supply unit comprising a power supply circuit accommodating chamber and an arithmetic circuit accommodating chamber partitioned from each other by a partition wall, wherein a power supply circuit substrate and an arithmetic circuit substrate are accommodated in said power supply circuit accommodating chamber and said arithmetic circuit accommodating chamber, respectively, wherein the arithmetic circuit accommodating chamber does not contain any power supply circuit components.

2. A power supply unit according to claim 1, wherein at least one of a CPU, an amplifier, a digital IC and an indication LED is contained on said arithmetic circuit substrate.

3. A power supply unit according to claim 2, wherein said arithmetic circuit substrate calculates an output voltage value and an output current value of said power supply unit.

4. A power supply unit according to claim 1, wherein said power supply circuit substrate and said arithmetic circuit substrate respectively have connectors, and said connectors are connected to each other through an opening formed in said partition wall.

5. A power supply unit comprising:
   a power supply accommodating chamber;
   an arithmetic circuit accommodating chamber partitioned from the power supply accommodating chamber by a partition wall, wherein a power supply circuit substrate and an arithmetic circuit substrate are accommodated in said power supply circuit accommodating chamber and said arithmetic circuit accommodating chamber, respectively,
   a casing having said power supply circuit accommodating chamber; and
   an auxiliary case, having said arithmetic circuit accommodating chamber, which is opened toward an outer wall of said casing.

6. A power supply unit according to claim 5, wherein at least one of a CPU, an amplifier, a digital IC and an indication LED is contained on said arithmetic circuit substrate.

7. A power supply unit according to claim 6, wherein said arithmetic circuit substrate calculates an output voltage value and an output current value of said power supply unit.

8. A power supply unit according to claim 5, wherein said power supply circuit substrate and said arithmetic circuit substrate respectively have connectors, and said connectors are connected to each other through an opening formed in said partition wall.

* * * * *